(12) United States Patent
Huang

(10) Patent No.: US 11,417,740 B2
(45) Date of Patent: *Aug. 16, 2022

(54) METHODS FOR FORMING RECESSES IN SOURCE/DRAIN REGIONS AND DEVICES FORMED THEREOF

(71) Applicant: Taiwan Semiconductor Manufacturing Co., Ltd., Hsinchu (TW)

(72) Inventor: Yu-Lien Huang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

This patent is subject to a terminal disclaimer.

(21) Appl. No.: 16/927,294

(22) Filed: Jul. 13, 2020

(65) Prior Publication Data

US 2020/0343351 A1    Oct. 29, 2020

Related U.S. Application Data

(63) Continuation of application No. 15/992,598, filed on May 30, 2018, now Pat. No. 10,714,578.

(51) Int. Cl.
*H01L 29/417* (2006.01)
*H01L 21/311* (2006.01)
(Continued)

(52) U.S. Cl.
CPC .... *H01L 29/41791* (2013.01); *H01L 21/3065* (2013.01); *H01L 21/30604* (2013.01); *H01L 21/31116* (2013.01); *H01L 21/31122* (2013.01); *H01L 21/31138* (2013.01); *H01L 21/76805* (2013.01); *H01L 21/76814* (2013.01); *H01L 21/76816* (2013.01); *H01L 21/76826* (2013.01); *H01L 21/76831* (2013.01); *H01L 21/76843* (2013.01); *H01L 21/823475* (2013.01);
(Continued)

(58) Field of Classification Search
CPC ......... H01L 21/76831; H01L 21/31138; H01L 21/3065; H01L 29/66636; H01L 29/401; H01L 21/76816; H01L 21/31116; H01L 21/30604; H01L 21/02063
See application file for complete search history.

(56) References Cited

U.S. PATENT DOCUMENTS 9,899,522 B1    2/2018    Liu et al.
10,199,260 B1    2/2019    Su et al.
(Continued)

FOREIGN PATENT DOCUMENTS

TW    201543679 A    11/2015
TW    201709341 A    3/2017
TW    201729238 A    8/2017

*Primary Examiner* — Julia Slutsker
(74) *Attorney, Agent, or Firm* — Slater Matsil, LLP

(57) ABSTRACT

Embodiments disclosed herein relate generally to methods for forming recesses in epitaxial source/drain regions for forming conductive features. In some embodiments, the recesses are formed in a two-step etching process including an anisotropic etch to form a vertical opening and an isotropic etch to expand an end portion of the vertical opening laterally and vertically. The recesses can have increased contact area between the source/drain region and the conductive feature, and can enable reduced resistance therebetween.

21 Claims, 14 Drawing Sheets

(51) Int. Cl.

| | | |
|---|---|---|
| *H01L 21/306* | (2006.01) | |
| *H01L 21/768* | (2006.01) | |
| *H01L 29/40* | (2006.01) | |
| *H01L 29/08* | (2006.01) | |
| *H01L 29/66* | (2006.01) | |
| *H01L 29/78* | (2006.01) | |
| *H01L 21/3065* | (2006.01) | |
| *H01L 21/8234* | (2006.01) | |
| *H01L 29/45* | (2006.01) | |
| *H01L 29/04* | (2006.01) | |
| *H01L 29/49* | (2006.01) | |
| *H01L 29/165* | (2006.01) | |
| *H01L 29/51* | (2006.01) | |
| *H01L 21/02* | (2006.01) | |
| *H01L 21/285* | (2006.01) | |
| *H01L 29/10* | (2006.01) | |

(52) U.S. Cl.
CPC ........ *H01L 29/0847* (2013.01); *H01L 29/401* (2013.01); *H01L 29/41766* (2013.01); *H01L 29/66636* (2013.01); *H01L 29/66795* (2013.01); *H01L 29/7853* (2013.01); *H01L 21/02063* (2013.01); *H01L 21/28518* (2013.01); *H01L 21/28556* (2013.01); *H01L 21/28568* (2013.01); *H01L 21/7684* (2013.01); *H01L 21/76819* (2013.01); *H01L 21/823425* (2013.01); *H01L 21/823431* (2013.01); *H01L 29/045* (2013.01); *H01L 29/1045* (2013.01); *H01L 29/165* (2013.01); *H01L 29/45* (2013.01); *H01L 29/495* (2013.01); *H01L 29/4958* (2013.01); *H01L 29/4966* (2013.01); *H01L 29/513* (2013.01); *H01L 29/517* (2013.01); *H01L 29/518* (2013.01); *H01L 29/66545* (2013.01); *H01L 2029/7858* (2013.01)

(56) References Cited

U.S. PATENT DOCUMENTS

| | | | |
|---|---|---|---|
| 2012/0164809 A1 | 6/2012 | Yoon et al. | |
| 2012/0241815 A1 | 9/2012 | Kim et al. | |
| 2013/0171795 A1* | 7/2013 | Pei | H01L 21/26586 438/303 |
| 2016/0181383 A1* | 6/2016 | Huang | H01L 29/41791 257/757 |
| 2016/0307777 A1* | 10/2016 | Kurata | H01L 21/76855 |
| 2018/0061652 A1* | 3/2018 | Tateyama | H01L 29/66727 |
| 2019/0088786 A1* | 3/2019 | Li | H01L 29/41733 |

* cited by examiner

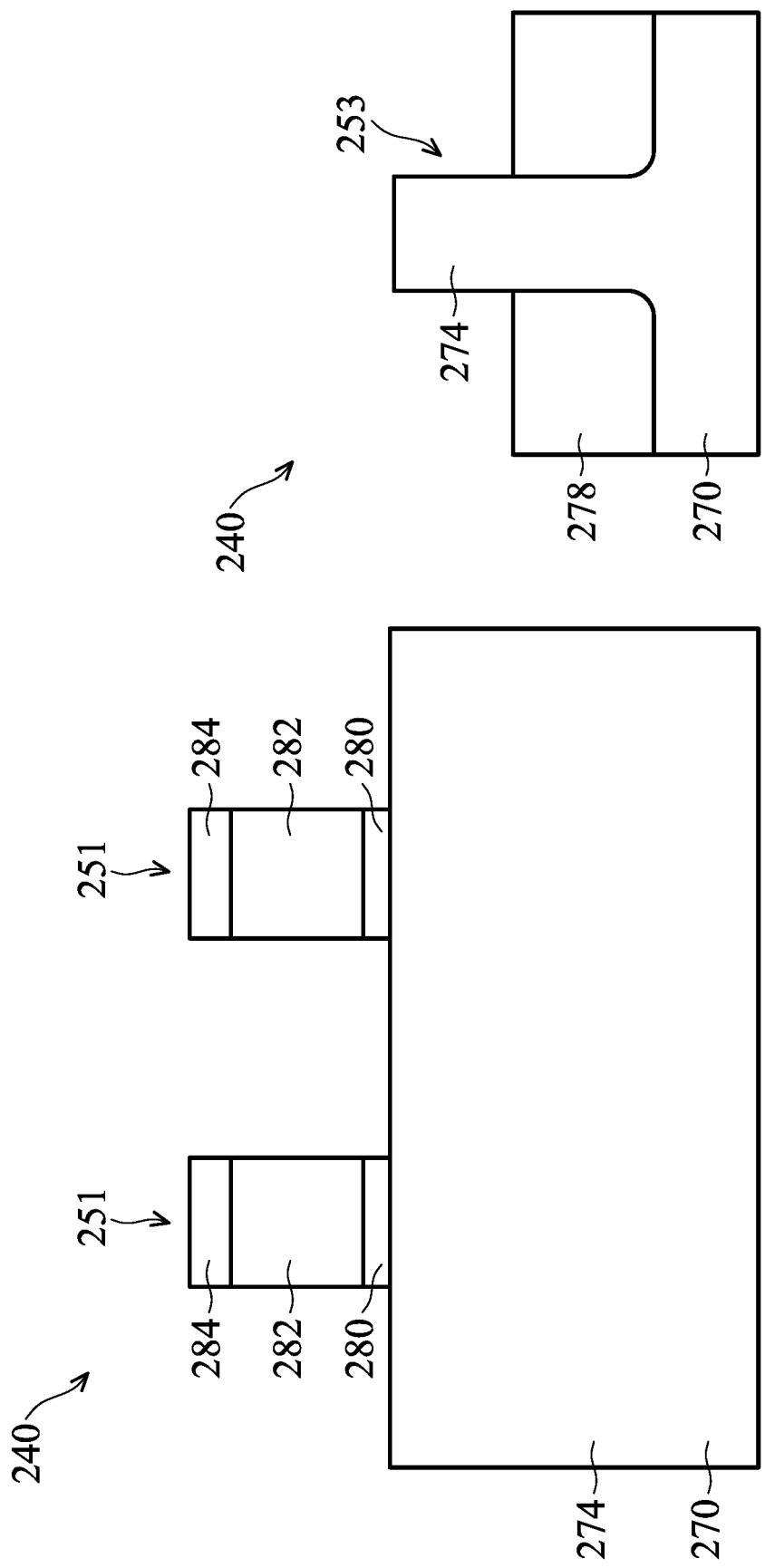

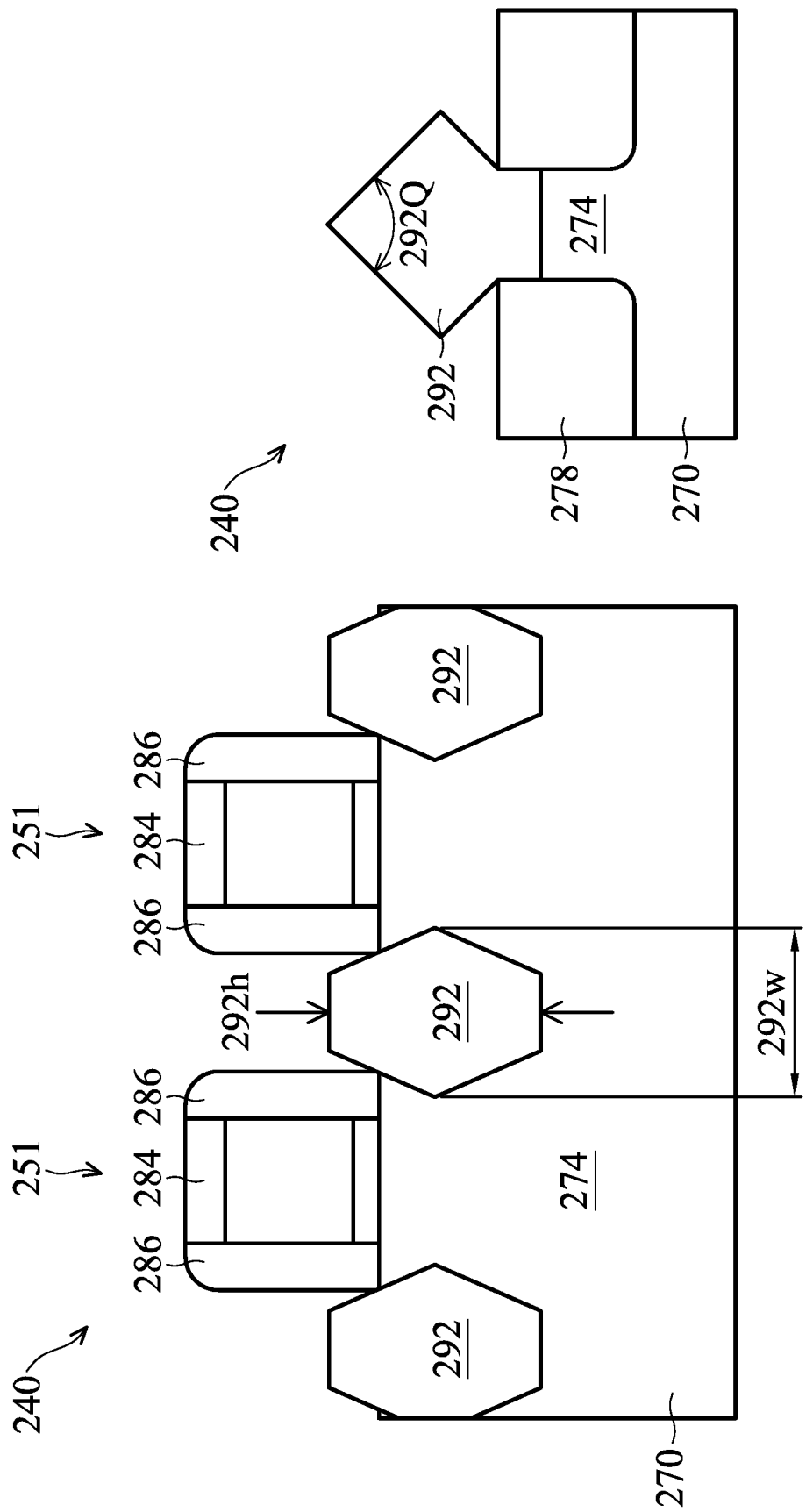

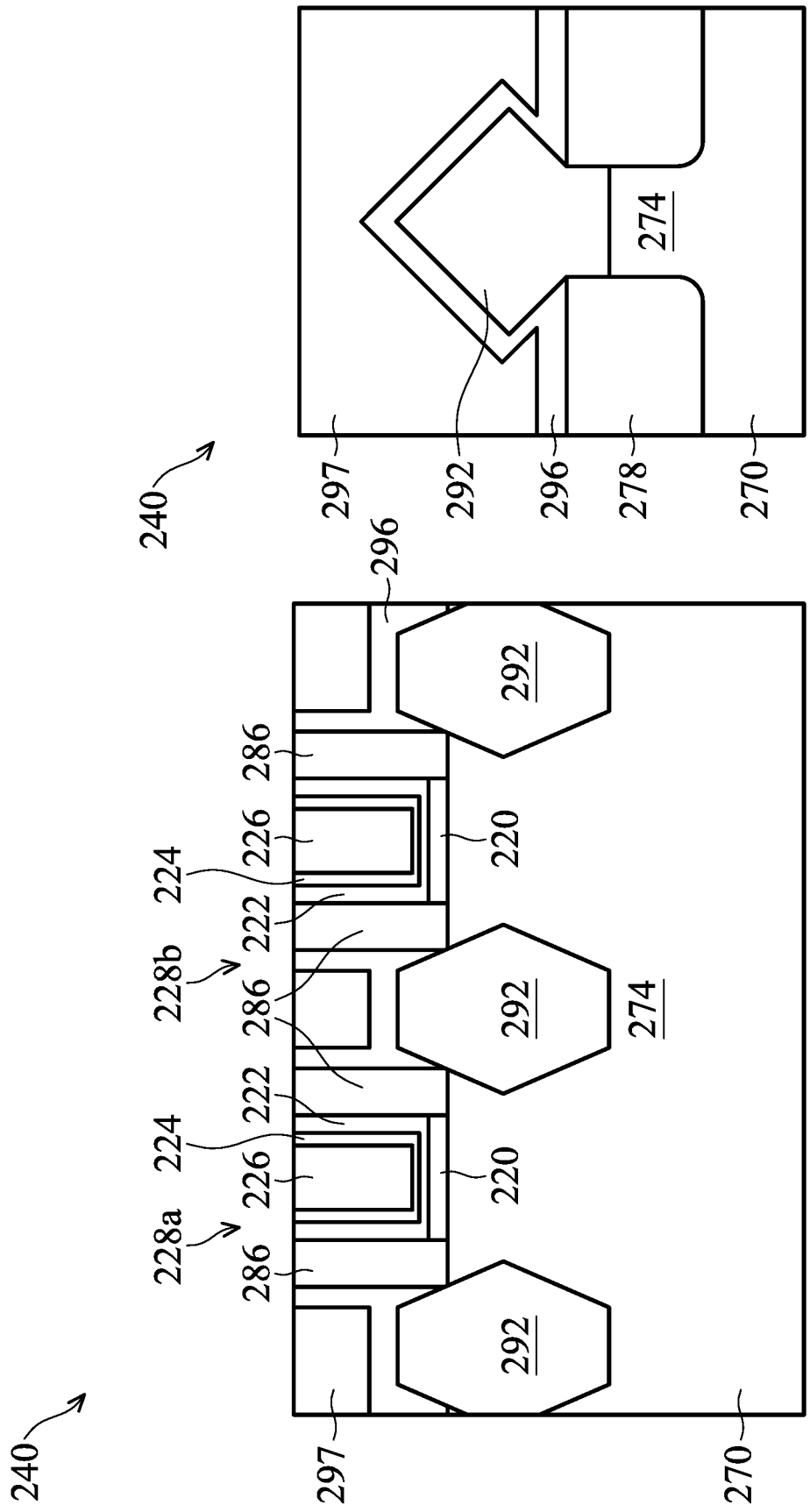

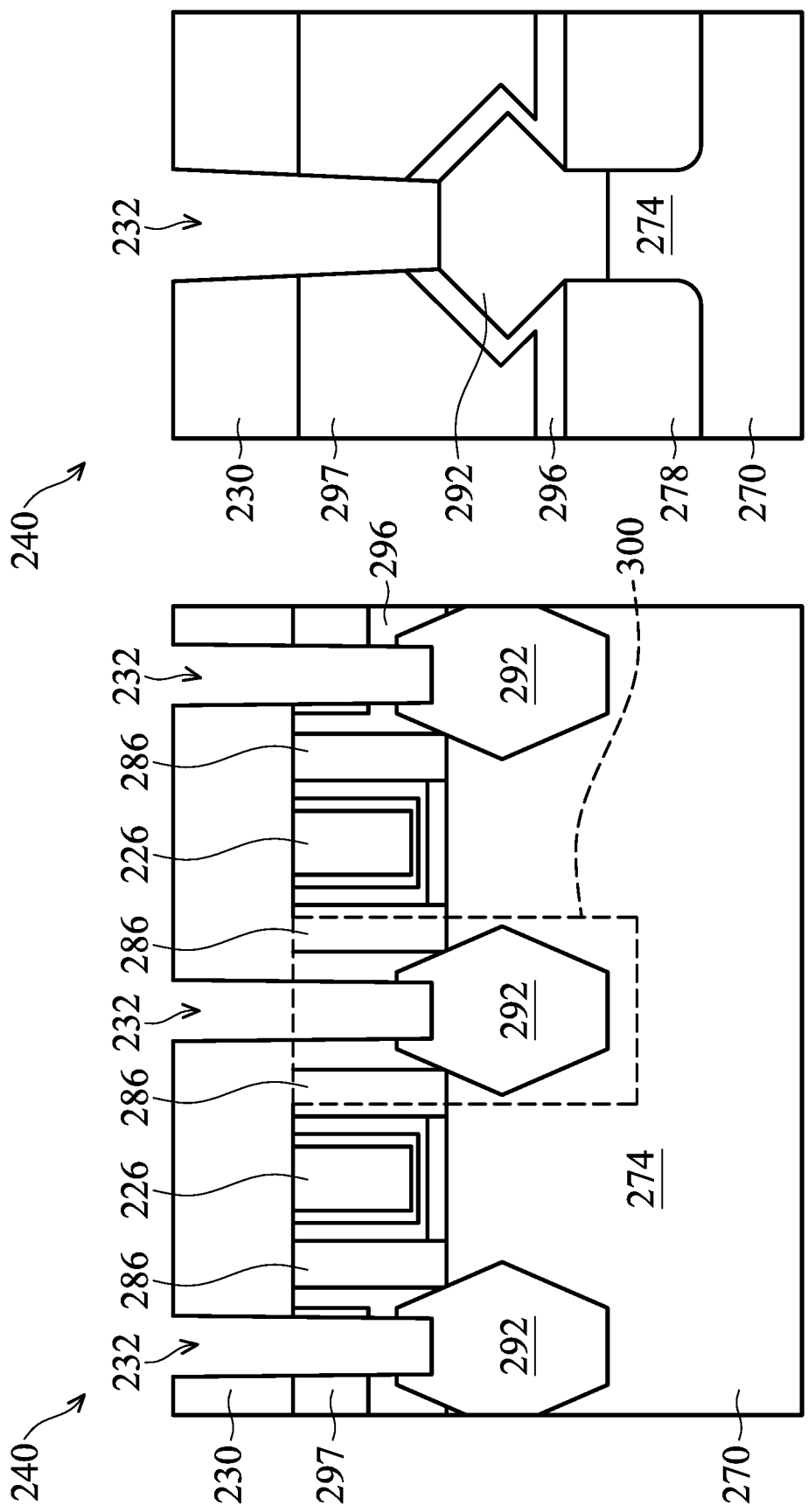

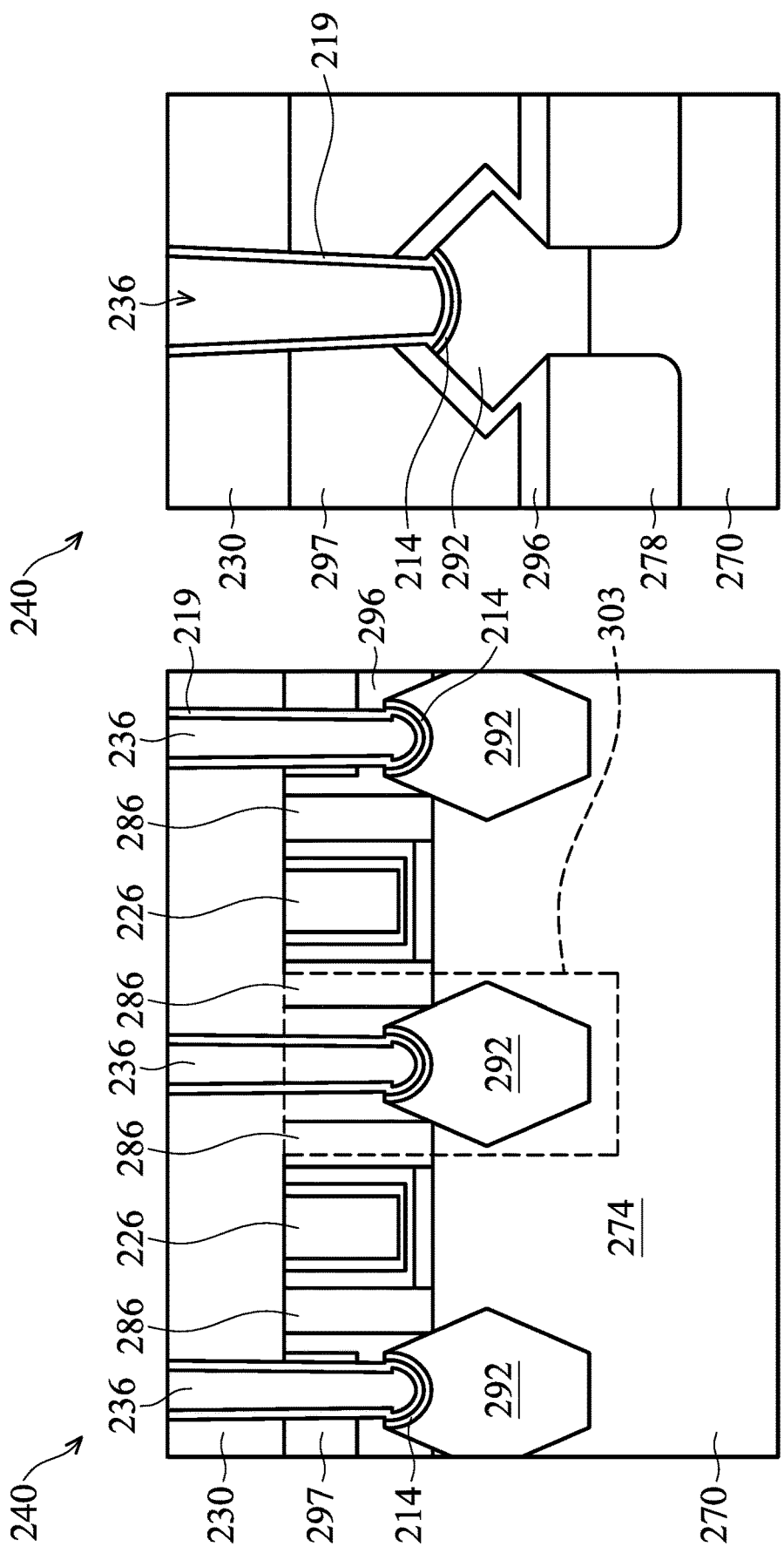

METHODS FOR FORMING RECESSES IN SOURCE/DRAIN REGIONS AND DEVICES FORMED THEREOF

PRIORITY CLAIM AND CROSS-REFERENCE

This application is a continuation of U.S. patent application Ser. No. 15/992,598, filed on May 30, 2018, now U.S. Pat. No. 10,714,578, which application is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a fin field-effect transistor (FinFET) is scaled down through various technology nodes, several strategies have been employed to improve device performance, such as using high-k dielectric materials and metal gate electrode structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 and 2A-2B, 3A-3B, 4A-4B, 5A-5B, 6A-6B, and 7A-7B are schematic three-dimensional and cross-sectional views of a portion of a semiconductor device corresponding to various stages in an example manufacturing process according to some embodiments.

DETAILED DESCRIPTION

Figure 1:
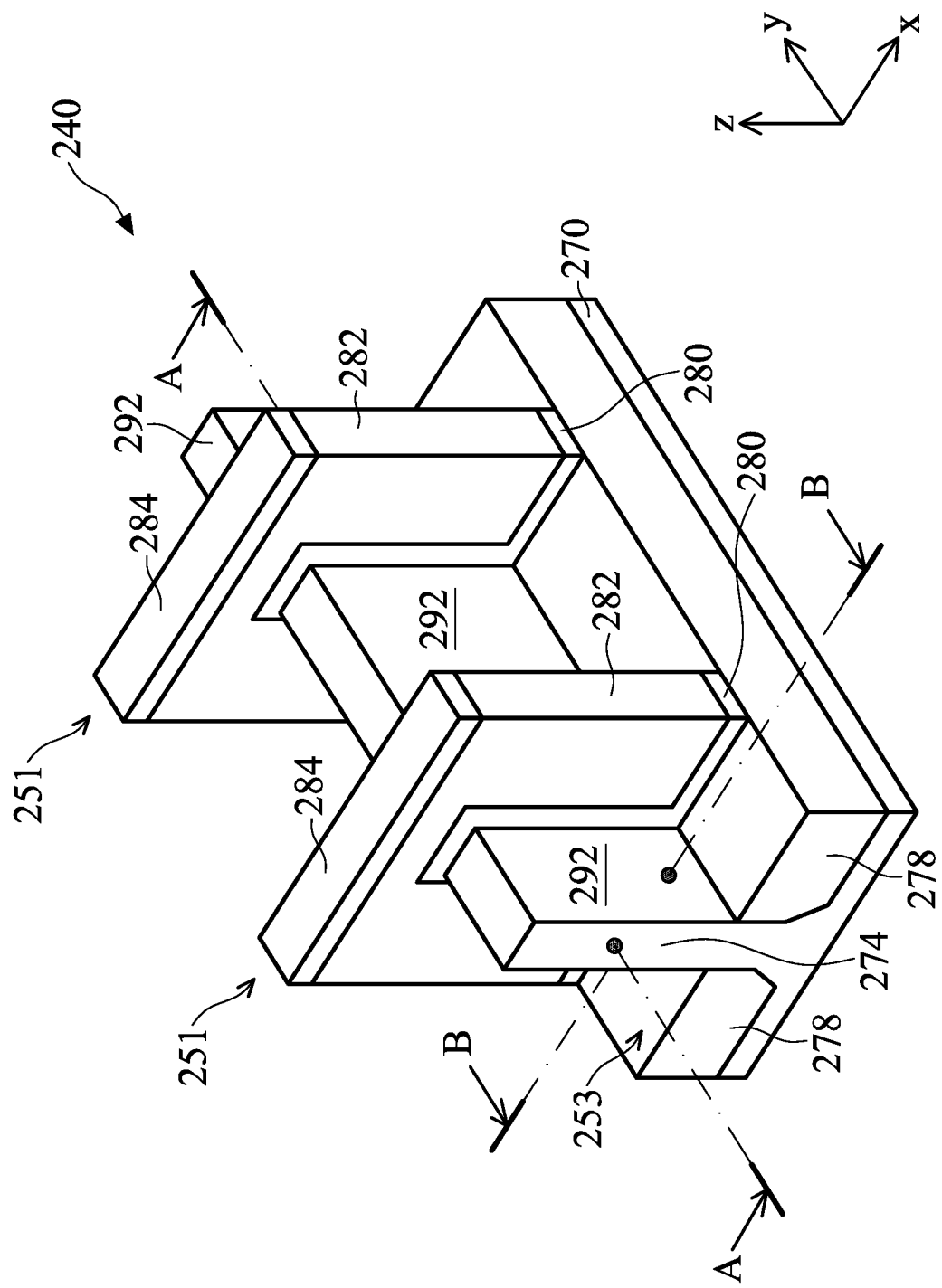

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to methods for forming recesses in epitaxial source/drain regions for forming conductive features. In some embodiments, the recesses are formed in a two-step etching process including an anisotropic etch and an isotropic etch. The recesses can have increased contact area between the source/drain region and the conductive feature, and can enable reduced resistance therebetween.

The foregoing broadly outlines some aspects of embodiments described in this disclosure. It is contemplated that the concepts of the present disclosure may be implemented for a planar transistor device or for a three-dimensional transistor device, such as the semiconductor device 240 described in this disclosure. Some example devices for which aspects described herein may be implemented include fin field effect transistors (FinFETs), Horizontal Gate All Around (HGAA) FETs, Vertical Gate All Around (VGAA) FETs, nanowire channel FETs, strained-semiconductor devices, silicon-on-insulator (SOI) devices, or other devices.

FIG. 1 illustrates an example of the semiconductor device 240 in a three-dimensional view. FIGS. 2A-2B through 7A-7B and 8A-8B through 9A-9B are schematic cross-sectional views of a portion of the semiconductor device 240 corresponding to various stages of fabrication according to some embodiments. It is noted that the methods described herein may be utilized to form any other semiconductor structures not presented herein. Those having ordinary skill in the art should recognize that the full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

As shown in FIG. 1, the semiconductor device 240 has a fin 274 formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof.

Each fin 274 provides an active area where one or more devices are formed. The fin 274 is fabricated using suitable processes including masking, photolithography, and/or etch processes to form trenches 253 in the substrate 270, leaving the fin 274 extended upwardly from the substrate 270. The trenches 253 may then be filled with an insulating material such as an oxide (e.g., silicon oxide), a nitride, the like, or a combination thereof. The insulating material may be recessed, such as by using an acceptable etch process, to form the isolation regions 278. The insulating material is recessed such that the fin 274 protrudes above and from between neighboring isolation regions 278.

The semiconductor device 240 includes gate structures 251 formed over top surfaces and along sidewalls of the fin 274. The gate structures 251 extend longitudinally perpendicularly to the fin 274. Each gate structure 251 includes a gate dielectric 280, a gate layer 282 over the gate dielectric 280, and a mask 284 over the gate layers 282. The semiconductor device 240 also includes source/drain regions 292 disposed in opposing regions of the fin 274 with respect to the gate structures 251.

The gate structures 251 can be operational gate stacks in a gate-first process or can be dummy gate stacks in a replacement gate process. For simplicity, a replacement gate process is described herein; a person having ordinary skill in the art will readily understand modifications to processing described herein to implement a gate-first process. In a replacement gate process, the gate dielectric 280 may be an interfacial dielectric, and the gate layer 282 may be a dummy gate. The gate dielectrics 280, the gate layers 282, and the mask 284 for the gate structures 251 may be formed by sequentially forming respective layers, such as by appropriate deposition techniques, and then patterning those layers into the gate structures 251, such as by appropriate photolithography and etching processes. The interfacial dielectrics may include or be silicon oxide, silicon nitride, the like, or multilayers thereof. The dummy gates may include or be silicon (e.g., polysilicon) or another material. The masks may include or be silicon nitride, silicon oxynitride, silicon carbon nitride, the like, or a combination thereof.

FIG. 1 further illustrates reference cross-sections that are used in later figures. Cross-section A-A is in a plane along, e.g., channels in the fin 274 between opposing source/drain regions 292. Cross-section B-B is in a plane perpendicular to cross-section A-A and is across a source/drain region 292 in the fin 274. Subsequent figures refer to these reference cross-sections for clarity. The following figures ending with an "A" designation illustrate cross-sectional views at various instances of processing corresponding to cross-section A-A, and the following figures ending with a "B" designation illustrate cross-section views at various instances of processing corresponding to cross-section B-B. FIGS. 2A and 2B illustrate in the respective cross-sectional views the semiconductor device 240 depicted in the three-dimensional view of FIG. 1.

In FIGS. 3A and 3B, gate spacers 286 are formed along sidewalls of the gate structures 251 (e.g., sidewalls of the gate dielectrics 280, gate layers 282, and masks 284) and over the fin 274. The gate spacers 286 may be formed by conformally depositing one or more layers for the gate spacers 286 and anisotropically etching the one or more layers, for example. The one or more layers for the gate spacers 286 may include a material different from the material(s) for the gate structure 251. In some embodiments, the gate spacers 286 may include or be a dielectric material, such as silicon oxygen carbide, silicon nitride, silicon oxynitride, silicon carbon nitride, the like, multi-layers thereof.

After the gate spacers 286 are formed, source/drain regions 292 may be formed in the fin 274, as depicted in FIGS. 3A and 3B. In some examples, such as illustrated in the figures, recesses can be etched in the fin 274 using the gate structures 251 as masks (such that recesses are formed on opposing sides of the gate structures 251), and a material may be epitaxially grown in the recesses to form the source/drain regions 292. Additionally or alternatively, the source/drain regions 292 may be formed by implanting dopants into the fins 274 and/or the epitaxial source/drain regions 292 using the gate structures 251 as masks (such that the source/drain regions are formed on opposing sides of the gate structures 251).

Depending on the conductivity type of the transistor, the material for the source/drain regions 292 may be chosen to include or be silicon germanium, silicon carbide, silicon phosphorus, silicon carbon phosphorus, germanium, a III-V compound semiconductor, a II-VI compound semiconductor, or the like. In some examples, SiGe may be included in the source/drain regions 292 for p-type devices, while SiCP or SiP may be included in the source/drain regions 292 for n-type devices. As illustrated in FIG. 3B, due to blocking by the isolation regions 278, the material in the source/drain regions 292 is first grown vertically in recesses, during which time the source/drain regions 292 do not grow horizontally. After the recesses are fully filled, the material for the source/drain regions 292 may grow both vertically and horizontally to form facets, which may correspond to crystalline planes of the semiconductor substrate 270. In some examples, different materials are used for epitaxy source/drain regions for p-type devices and n-type devices. Appropriate masking during the recessing or epitaxial growth may permit different materials to be used in different devices.

As shown in FIG. 3A, the epitaxial source/drain regions 292 are formed between the gate structures 251 in place of the removed portions of the fin 274. In some embodiments, a cross-sectional area of the epitaxial source/drain regions 292 along the A-A line may be shaped like a hexagon, although other cross-sectional areas may be implemented, such as other shapes due to the etching process used to recess the fin 274. The cross-sectional area along the A-A line may have a height $292h$ and a width $292w$. In some embodiments, the height $292h$ may be in a range from about 40 nm to about 50 nm. In some embodiments, the width $292w$ may be greater than 30 nm, for example, in a range from about 30 nm to about 50 nm.

In FIG. 3B, the epitaxial source/drain regions 292 are grown epitaxially from the fin 274 along a recess between the isolation regions 278. The epitaxial source/drain region 292 extends upward from the recess between the isolation regions 278 forming a substantially rhombus shape along the B-B line due to the crystallographic orientation of the material being grown, although other shapes may be formed. In some embodiments, the epitaxial source/drain regions 292 may have a rhombus cross-sectional area having a top angle 292Q along the B-B line. In some embodiments, the top angle 292Q is in a range from about 60 degrees to about 160 degrees, for example from about 70 degrees to about 80 degrees.

In the example shown in FIGS. 3A and 3B, the epitaxial source/drain regions 292 have varying widths along the respective cross-sections as the epitaxial source/drain regions 292 are traversed from respective bottom portions to top portions of the epitaxial source/drain regions 292. The width increases from the top portion of the respective epitaxial source/drain region 292 to an intermediate portion of the epitaxial source/drain region 292, and then decreases from the intermediate portion of the epitaxial source/drain region 292 to the bottom portion of the epitaxial source/drain region 292.

In FIGS. 4A and 4B, after formation of the source/drain region 292, an contact etch stop layer (CESL) 296 is conformally formed on surfaces of the source/drain regions 292, sidewalls and top surfaces of the gate spacers 286, top surfaces of the masks 284, and top surfaces of the isolation regions 278. A first interlayer dielectric (ILD) 297 is formed on the CESL 296. The CESL 296 and first ILD 297 can be deposited using any suitable deposition technique. The CESL 296 may include or be silicon nitride, silicon carbon nitride, silicon carbon oxide, carbon nitride, the like, or a combination thereof. The first ILD 297 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorosilicate glass (FSG), organosilicate glass (OSG), $SiO_xC_y$, Spin-On-Glass, Spin-On-Polymers, silicon carbon material, a compound thereof. A chemical mechanical polishing (CMP) process may then be performed to planarize the first ILD 297 and the CESL 296 and to remove the masks 284 of the gate structures 251, thereby leveling the top surface of the first ILD 297 and CESL 296 with the top surfaces of the gate layers 282.

After the CMP process, the gate structures 251 are removed using one or more etch processes so that replacement gate structures 228a, 228b can be formed in the recesses formed by removing the gate structures 251. Upon removal of the gate structures 251, recesses are formed between the gate spacers 286 where the gate structures 251 are removed, and channel regions of the fins 274 are exposed through the recesses. The replacement gate structures 228a, 228b are then formed in the recesses where the gate structures 251 were removed.

The replacement gate structures 228a, 228b each may include, as illustrated in FIG. 4A, an interfacial dielectric 220, a gate dielectric layer 222, one or more optional conformal layers 224, and a gate metal fill 226. The interfacial dielectric 220 is formed on a top surface and sidewalls of the fin 274 along the channel regions. The interfacial dielectric 220 can be an oxide (e.g., silicon oxide), nitride (e.g., silicon nitride), and/or another dielectric layer using any suitable deposition technique.

The gate dielectric layer 222 can be conformally deposited in the recesses where gate stacks were removed (e.g., on the interfacial dielectric 220 and sidewalls of the gate spacers 286) and on the top surfaces of the first ILD 297, the CESL 296, and gate spacers 286. The gate dielectric layer 222 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, barrier layer, and/or capping layer are selected so that a desired threshold voltage (Vt) is achieved for the transistor, which could be a p-type transistor or an n-type transistor. The gate metal fill 226 is formed over the one or more conformal layers 224, if implemented, and/or the gate dielectric layer 222. The gate metal fill 226 can fill remaining recesses where the gate structures 251 were removed. The gate metal fill 226 may be or include a metal-containing material such as tungsten, cobalt, aluminum, ruthenium, copper, multilayers thereof, a combination thereof, or the like.

A planarization process, like a CMP, may remove portions of the layer for the gate metal fill 226, one or more conformal layers 224, and gate dielectric layer 222 above the top surfaces of the first ILD 297, the CESL 296, and gate spacers 286. The replacement gate structures 228 including the gate metal fill 226, one or more conformal layers 224, gate dielectric layer 222, and interfacial dielectric 220 may therefore be formed.

In FIGS. 5A and 5B, after the planarization process, a second ILD 230 is formed over the replacement gate structures 228, first ILD 297, gate spacers 286, and CESL 296. The second ILD 230 may include or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof, and may be deposited using any acceptable deposition technique.

After the second ILD 230 is formed, source/drain contact openings are formed through the second ILD 230, the first ILD 297, and the CESL 296 to the source/drain regions 292 to expose at least portions of the source/drain regions 292. According to some embodiments, the source/drain contact openings may be formed through a two-step etching process, which includes an anisotropic etching process to form vertical openings 232 as shown in FIGS. 5A and 5B and an isotropic etching process to increase surface area at the bottom of the vertical opening as shown in FIGS. 6A and 6B and FIGS. 8A and 8B.

In FIGS. 5A and 5B, vertical openings 232 are formed through the second ILD 230, the first ILD 297, and the CESL 296 using photolithography and one or more anisotropic etch processes. The one or more etch processes may be a dry etching process, a Deep Reactive-Ion Etching (DRIE) process, or any suitable anisotropic etch process.

Figure 10:
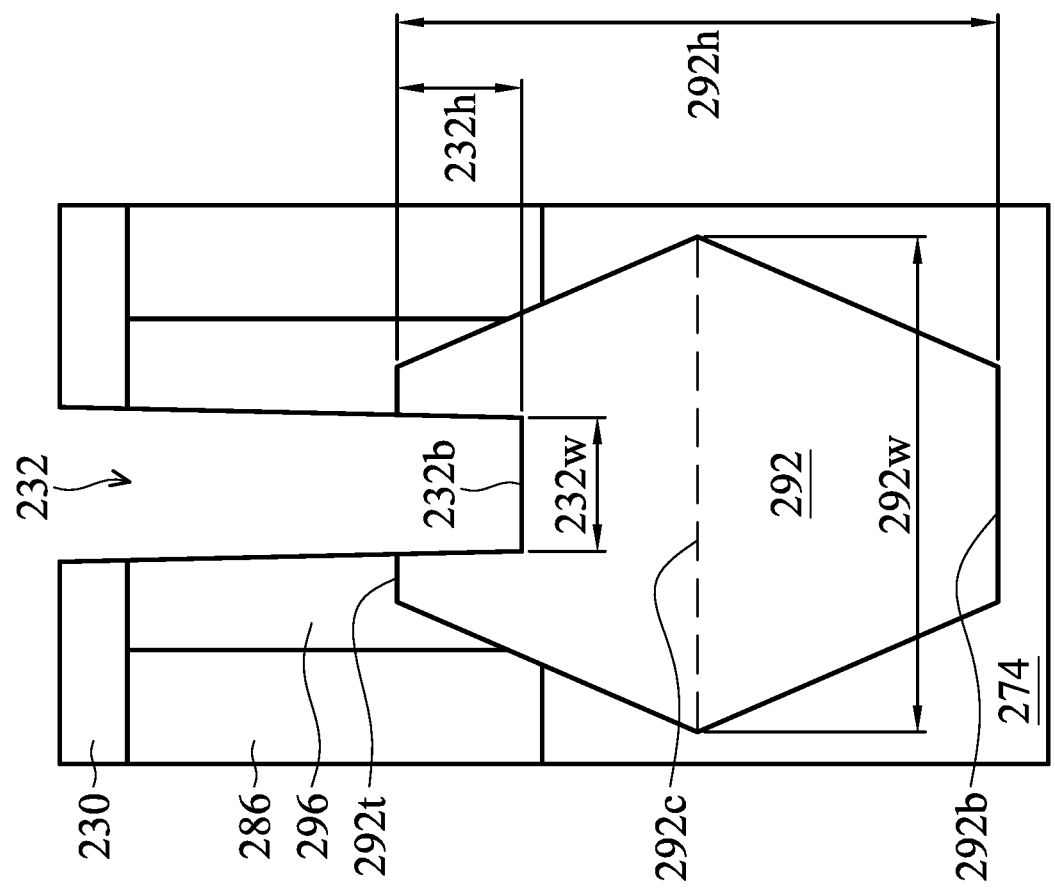
FIG. 10 illustrates a portion of the cross-sectional view of FIG. 5A to further illustrate additional details in accordance with some embodiments.

FIG. 10 is an enlarged view of region 300 in FIG. 5A showing details of a bottom portion of the vertical opening 232. The vertical openings 232 may be holes or trenches extending into the epitaxial source/drain regions 292. The sidewalls of the source/drain vertical openings 232 are substantially vertical, although there may be a small tilt angle. The vertical opening 232 has a width 232w near a bottom surface 232b of the vertical opening 232. In some embodiments, the width 232w may be in a range from about 10 nm to about 40 nm. In some embodiments, the width 232w may be in a range from about 33% to about 100% of the width 292w of the epitaxial source/drain region 292.

The vertical opening 232 extends into the epitaxial source/drain region 292 such that the bottom surface 232b of the vertical opening 232 is below a top 292t of the epitaxial source/drain region 292. A height 232h indicates a distance from the top 292t of the epitaxial source/drain region 292 to the bottom surface 232b of the vertical opening 232. In some embodiments, the height 232h may be in a range from greater than 0 nm to about 20 nm. In some embodiments, the height 232h may be in a range from greater than 0% to about 50% of the height 292h.

In the example showing FIG. 10, the width of the cross section of the source/drain region 292 in the A-A cut (or the cross section parallel to the y-z plane in the x-y-z coordinate shown in FIG. 1) increases from the top 292t to the intermediate portion and decreases from the intermediate portion to a bottom 292b. A center line 292c indicates the vertical location of the cross-section area with the largest width 292w. Corresponding to the increases and decreases in the width in the y-z planes, the size and perimeter of the cross section of the source/drain region 292 in x-y planes also increase from the top 292t to the center line 292c and decreases from the center line 292c to the bottom 292b. According to some embodiments, the bottom surface 232b is above the center line 292c.

The vertical opening 232 may be formed by one or more anisotropic etch processes. For example, a first anisotropic etch process may be performed to etch through the second ILD 230, the first ILD 297, and the CESL 296, and a second anisotropic etch process may be performed to form a recess of the height 232h in the epitaxial source/drain region 292. In some embodiments, the first anisotropic etch process and the second anisotropic etch process may be the same process performed together in a single operation. In other embodiments, the first anisotropic etch process and the second anisotropic process are different processes with different etch chemistry and/or process parameters.

In some embodiments, the first anisotropic etch process may be a dry etching process, such as a Deep Reactive-Ion Etching (DRIE) process, or any suitable anisotropic etch process. In some examples, the first anisotropic etch process may be performed using inductive coupled plasma (ICP) or capacitive coupled plasma (CCP) containing oxygen, argon, and one or more fluorocarbon-based gas such as hexafluorobutadiene ($C_4F_6$), octafluorocyclobutane ($C_4F_8$), or carbon tetrafluoride ($CF_4$).

In some embodiments, the second anisotropic etch process may be a dry etch process performed using an inductive coupled plasma (ICP) or capacitive coupled plasma (CCP) of an etchant. In some embodiments, the etchant may contain one or more fluorocarbon-based gas such as carbon tetrafluoride ($CF_4$), trifluoromethane ($CHF_3$); one or more fluorine-based gas, such as nitrogen trifluoride ($NF_3$), sulfur hexafluoride ($SF_6$), hexafluorobutadiene ($C_4F_6$), and octafluorocyclobutane ($C_4F_8$); a chlorine-based gas, such as chlorine gas ($Cl_2$); and/or a bromine-based gas such as hydrogen bromide (HBr).

In some examples, the vertical opening 232 is formed by continuously performing a dry etch process using an inductively coupled plasma. The RF power of the plasma generator can be in a range from about 100 W to about 2000 W to induce and maintain a plasma of the etchant in a process chamber. The process chamber may have a chamber pressure in a range from about 3 mTorr to about 20 mTorr. A bias voltage in a range from about 20 volt to about 1500 volt can be applied to the plasma to achieve anistropic etching. In some embodiments, the anisotropic etch process may be performed for a duration in a range from about 155 seconds to about 1800 seconds. For example, the etch process may be performed for a duration in a range between about 200 seconds to about 1200 seconds, for example about 150 seconds, to form an opening through the second ILD 230, the first ILD 297, and the CESL 296. After the CESL 296 is removed, an additional etching may be performed for a duration in a range from about 5 seconds to about 1050 seconds to recess the vertical opening 232 into the epitaxial source/drain regions 292 for the height 232h.

Figures 6A, 6B:
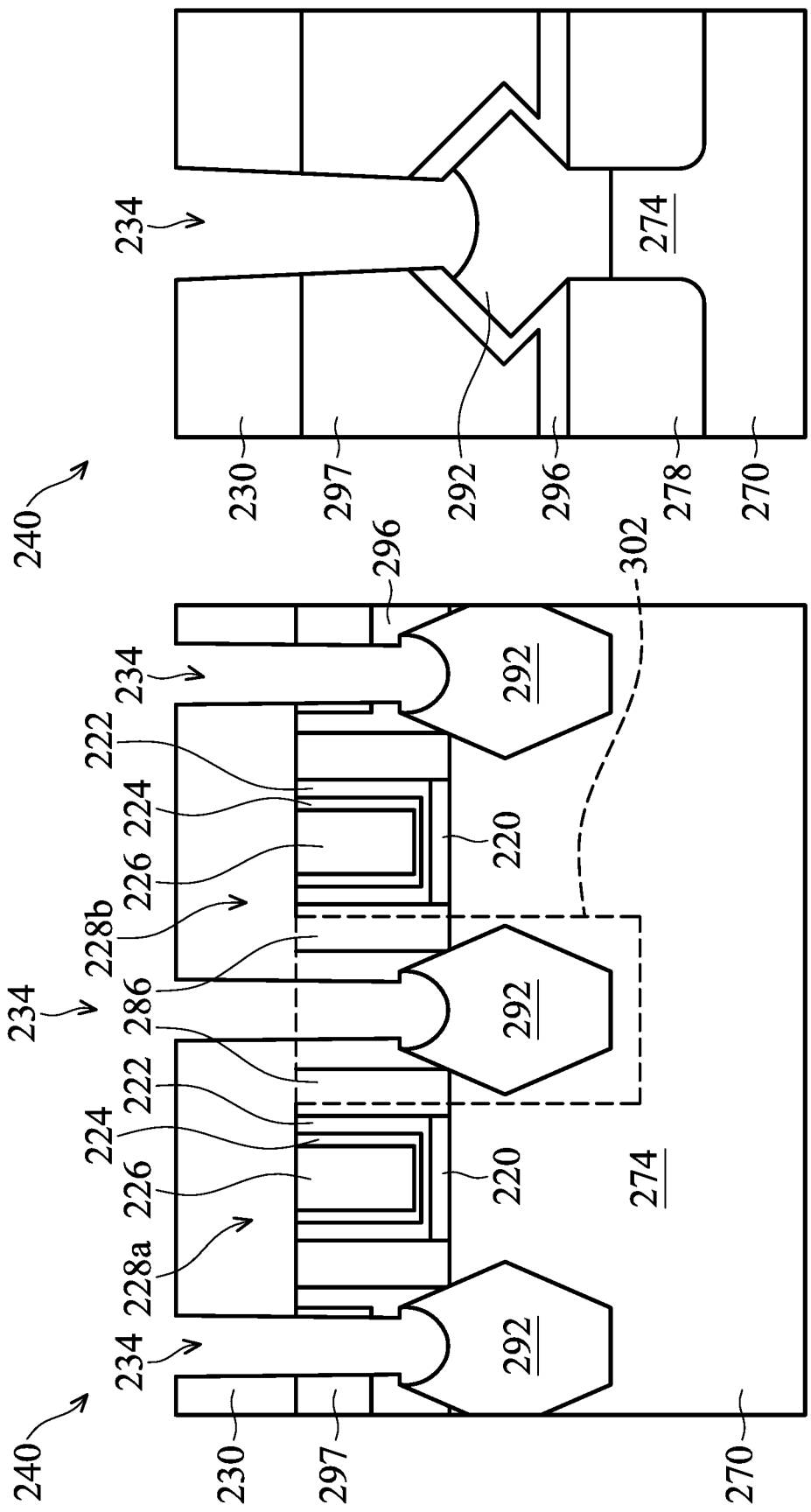

After formation of the vertical openings 232, the bottom portion of the vertical openings 232 is expanded by an etching process, such as an isotropic etch process. As shown in FIGS. 6A and 6B, expanded openings 234 are formed from the vertical openings 232 to allow making electrical contact to the source/drain regions 292 for the transistors.

In some embodiments, the expanded openings 234 are formed by an isotropic etch process that has a high etching selectivity between the epitaxial source/drain regions 292 to the second ILD 230, first ILD 297, and CESL 296. As a result, the expanded openings 234 and the vertical openings 232 are substantially the same in dimension in the second ILD 230, the first ILD 297, and CESL 296 while the expanded openings 234 are deeper and have a larger width in the epitaxial source/drain regions 292 than the vertical openings 232.

Figure 11:
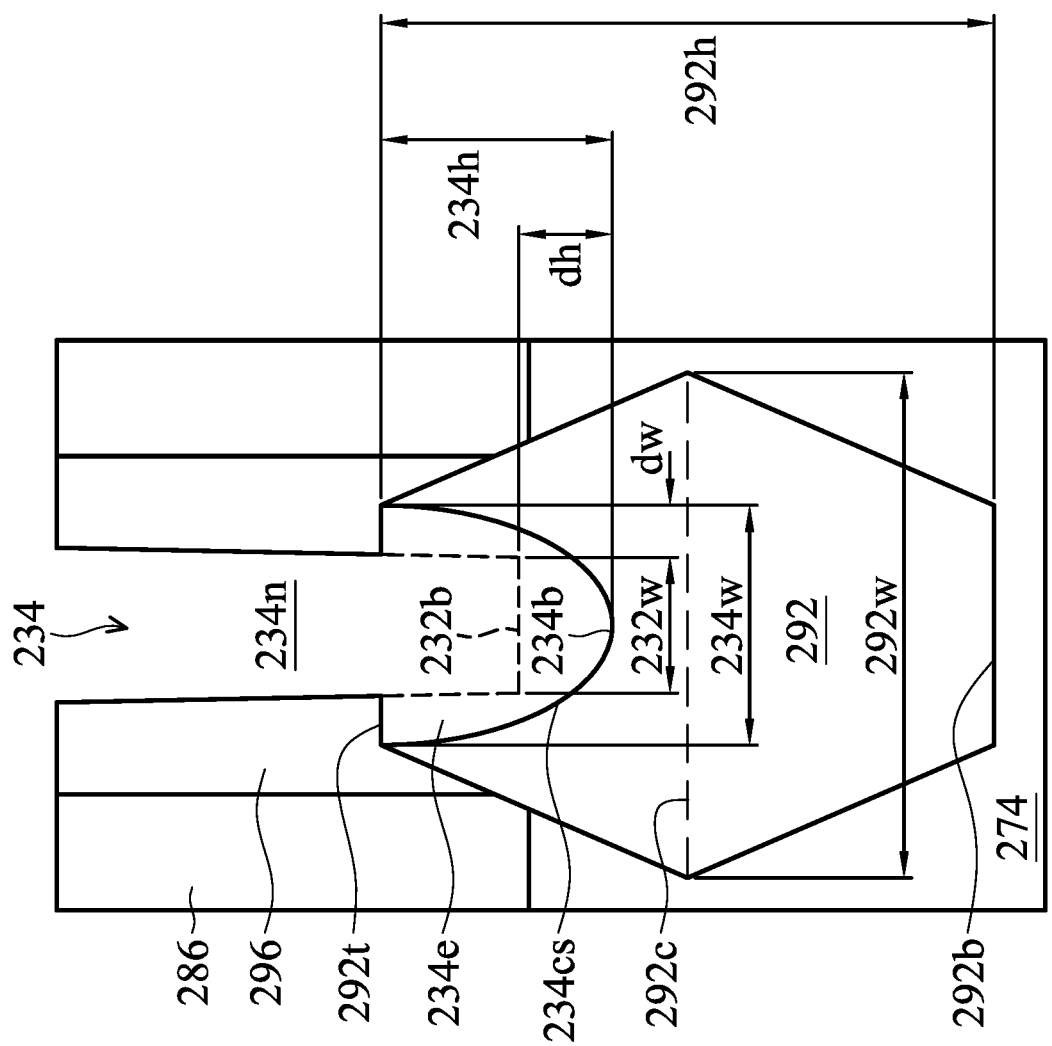
FIG. 11 illustrates a portion of the cross-sectional view of FIG. 6A to further illustrate additional details in accordance with some embodiments.

FIG. 11 is an enlarged view of region 302 in FIG. 6A showing details of a bottom portion of the expanded opening 234. The bottom portion of the vertical opening 232 is shown in dashed line. The expanded opening 234 includes a neck portion 234n formed through the second ILD 230, first ILD 297, and CESL 296 and an end portion 234e formed in the epitaxial source/drain region 292. The end portion 234e may have a partial-elliptical cross-section area along the cross-section A-A (refer to FIG. 1). The end portion 234e may have a partial spheroid shape with a partial spheroidal bottom surface 234cs formed in the epitaxial source/drain regions 292. As discussed in FIG. 10, the size and perimeter of the cross section of the source/drain region 292 in x-y planes also increase from the top 292t to the center line 292c and decreases from the center line 292c to the bottom 292b. Isotropically etching the source/drain region 292 after formation of the vertical opening 232 allows the size of the bottom surface 234cs to expand, and thus, allows the contact area between the source/drain region 292 and the metal fill to be filled in the opening 234 to increase.

A height 234h indicates a distance from the top 292t of the epitaxial source/drain region 292 to a bottom point 234b of the end portion 234e expanded opening 234. In some embodiments, the height 234h may be in a range from about 5 nm to about 20 nm. In some embodiments, the height 234h may be in a range from about 10% to about 50% of the height 292h of the epitaxial source/drain region 292. In some embodiments, the bottom surface 234cs is above the position of the center line 292c of the epitaxial source/drain region 292 in the cross-section A-A.

In some embodiments, a width 234w of the end portion 234e may be in a range from about 14 nm to about 40 nm. In some embodiments, the width 234w may be in a range from about 30% to about 80% of the width 292w of the epitaxial source/drain region 292.

The end portion 234e is formed by laterally expanding the vertical openings 232 in the epitaxial source/drain region 292 by a lateral expansion amount dw and by vertically expanding the vertical opening 232 in the epitaxial source/drain region 292 by a vertical expansion amount dh. In some embodiments, the vertical expansion amount dh can be in a range from about 5 nm to about 20 nm. For example, for an n-type FinFET device, the vertical expansion amount dh can be in a range from about 5 nm to about 20 nm. For a p-type FinFET device, the vertical expansion amount dh can be in a range from about 5 nm to about 10 nm. In some embodiments, the lateral expansion amount dw can be in a range from about 2 nm to about 10 nm. Hence, the width 234w of the end portion 234e can be in a range from about 4 nm to about 20 nm greater than the width 232w of the openings 234. In some examples, the width 234w of the end portion 234e is equal to or greater than about 5% more than the width 232w of the openings 234, such as in a range from about 5% to about 50% more than the width 232w of the openings 234. The increased width 234w can increase surface area to which a conductive feature can contact the source/drain regions 292. More specifically, for example, for an n-type FinFET device, the lateral expansion amount dw can be in a range from about 2 nm to about 10 nm. For a p-type FinFET device, the lateral expansion amount dw can be in a range from about 2 nm to about 5 nm. In some embodiments, the source/drain regions 292 in n-type devices and in p-type devices can have different dimensions (e.g., widths and/or heights) due to different materials that are epitaxially grown as the source/drain regions 292. For example, heights and widths of source/drain regions 292 of p-type devices can be smaller than heights and widths of source/drain regions 292 of n-type devices, and hence, vertical expansion amounts dh and lateral expansion amount dw in source/drain regions 292 of p-type devices can be less than vertical expansion amounts dh and lateral expansion amount dw in source/drain regions 292 of n-type devices.

In some embodiments, the lateral expansion amount dw and the vertical expansion amount dh may be achieved by an isotropic etch process, such as an isotropic dry etch process or an isotropic wet etch process.

In some embodiments, the lateral expansion amount dw and the vertical expansion amount dh may be achieved by a dry etch process using an inductively coupled plasma. The etchant may include one of fluorocarbon-based gas such as carbon tetrafluoride ($CF_4$), trifluoromethane ($CHF_3$); one or more fluorine-based gas, such as nitrogen trifluoride ($NF_3$), sulfur hexafluoride ($SF_6$); a chlorine-based gas, such as chlorine gas ($Cl_2$); and/or a bromine-based gas, such as hydrogen bromide (HBr). The RF power of the plasma generator can be in a range from about 100 W to about 2000 W to induce and maintain a plasma of the etchant in a process chamber. The process chamber may have a chamber pressure in a range from about 30 mTorr to about 800 mTorr. A bias voltage in a range from about 0 volt to about 200 volt can be applied to the plasma. In some embodiments, the dry etch process may be performed for a duration in a range from about 5 seconds to about 100 seconds.

In some embodiments, the isotropic dry etch process may be performed in the same dry etch chamber where the anisotropic dry etch processes are performed. Upon formation of the vertical openings 232 shown in FIGS. 5A and 5B, processing parameters of the dry etch chamber are adjusted to perform an isotropic dry etch to form the end portion 234e of the expanded opening 234.

In some embodiments, the lateral expansion amount dw and the vertical expansion amount dh may be achieved by a wet etch process, for example a wet etching process using ammonium hydroxide-peroxide water mixture (APM), such as a wet etching solution having ammonium hydroxide ($NH_4OH$), hydrogen peroxide ($H_2O_2$), and deionized water ($H_2O$) in a ratio between about 1:1:8000 to about 1:1:100 ($NH_4OH:H_2O_2:H_2O$). In some embodiments, the wet etching process may be performed in an APM mixture for a duration in a range from about 5 seconds to about 300 seconds.

After the formation of the expanded opening 234, a pre-silicide clean process may be performed to remove native oxide (e.g., $SiO_2$) from the surfaces of the exposed source/drain regions 292 that may be formed due to exposure to various etchants during formation of the expanded openings 234. Example pre-silicide clean processes may include a wet cleaning using a dilute HF aqueous solution or a dry cleaning using a plasma (e.g., a $NF_3/NH_3$ plasma), or a combination of both. The chemistries used during the pre-silicide clean may remove native oxide as well as an upper portion of the source/drain regions 292.

A conformal metal layer (not shown) is formed on the surfaces of the exposed source/drain regions 292 (e.g., a partial spheroidal bottom surface 234cs) and over the surfaces of the second ILD 230, the first ILD 297, and the CESL 296. In some embodiments, the conformal metal layer may include a single layer of titanium, tantalum, or the like. In other embodiments, the conformal metal layer may be a multi-layer stack (e.g., a bi-layer), for example a first layer including titanium, tantalum, or the like, and a second layer including titanium nitride, titanium oxide, tantalum nitride, tantalum oxide, or the like. The metal layer may be deposited by atomic layer deposition (ALD), physical vapor deposition (PVD), chemical vapor deposition (CVD), or any suitable deposition technique.

After formation of the metal layer, a silicide layer 214 is formed on the source/drain regions 292 by reacting an upper portion of the source/drain regions 292 with the metal layer, as shown in FIGS. 7A and 7B. The substrate 270 is heated, for example, by performing an anneal process, to cause the silicide reaction to occur wherever the metal layer is in contact with the source/drain regions 292. The anneal process can be, for example, a rapid thermal anneal (RTA) performed at a temperature in a range from about 400° C. to about 650° C., such as about 500° C., for a duration in a range from about 10 seconds to about 60 seconds. The un-reacted metal layer may be removed by a selective etch process that attacks un-reacted metal layer but does not attack the silicide layer 214, or may remain as an adhesion and/or barrier layer, for example.

As shown in FIGS. 7A and 7B, a barrier layer 219 is conformally deposited in the expanded openings 234 on the silicide layer 214 and over the second ILD 230, the first ILD 297, and the CESL 296. The barrier layer 219 may have a thickness of about 2 nm or less, such about 1.8 nm or less, for example about 1.6 nm. The barrier layer 219 may be or include titanium nitride, titanium oxide, tantalum nitride, tantalum oxide, any suitable transition metal nitrides or oxides, the like, or any combination thereof, and may be deposited by ALD, CVD, PECVD, HDP-CVD, low-pressure CVD (LPCVD), or physical vapor deposition (PVD), or any suitable deposition technique. In some examples, the barrier layer is TiN deposited by ALD.

A conductive material 236 (e.g., contact metal) can be deposited on the barrier layer 219 and fill the expanded openings 234. The conductive material 236 may be or include cobalt, tungsten, copper, ruthenium, aluminum, gold, silver, alloys thereof, the like, or a combination thereof, and may be deposited by CVD, ALD, PVD, or any suitable deposition technique. After the conductive material 236 is deposited, excess conductive material 236 and barrier layer 219 may be removed by using a planarization process, such as a CMP, for example. The planarization process may remove excess conductive material 236 and barrier layer 219 from above a top surface of the second ILD 230, as shown in FIGS. 7A and 7B.

Figure 12:
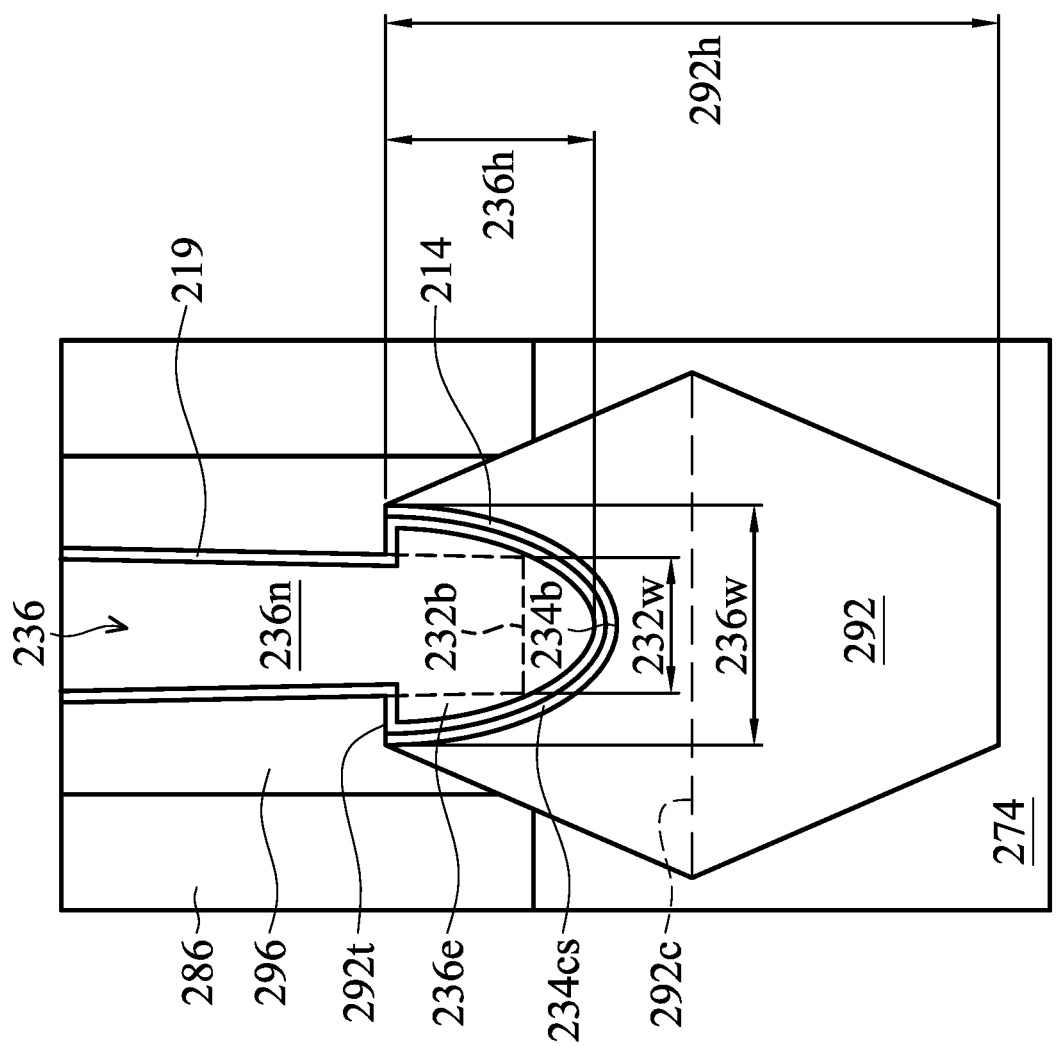
FIG. 12 illustrates a portion of the cross-sectional view of FIG. 7A to further illustrate additional details in accordance with some embodiments.

FIG. 12 is an enlarged view of region 303 in FIG. 7A showing the details of the conductive material and the silicide layer 214. The silicide layer 214 corresponds to the partial spheroidal bottom surface 234cs of the end portion 234e in the expanded opening 234, and therefore, has an increased surface area. The increased surface area of the silicide layer 214 can reduce the resistance between the epitaxial source/drain region 292 and the contact formed in the expanded opening 234.

The conductive material 236 includes a neck portion 236n formed through the second ILD 230, first ILD 297, and CESL 296 and an end portion 236e formed on the epitaxial source/drain region 292. The neck portion 236n may be a trench or a cylinder having substantially vertical walls. The neck portion 236n may have a width in a range from about 10 nm to about 50 nm. The end portion 236e may have a partial-elliptical cross section area along the cross-section A-A (refer to FIG. 1). The end portion 236e may have a partial spheroid shape with a partial spheroidal bottom surface facing the silicide layer 214.

A height 236h of the end portion 236e may be in a range from about 5 nm to about 25 nm. A width 236w of the end portion 234e may be in a range from about 15 nm to about 50 nm. In some embodiments, the width 236w of the end portion 236e may be greater than the width of the neck portion 263n by an amount in a range from about 2 nm to about 20 nm. The depth and width of the end portion 236e can enable increased contact surface of the end portion 236e to the epitaxial source/drain region 292, and thus, can enable reducing resistance therebetween.

The expanded openings may have various shapes depending on, for example, (i) the dimensions of the epitaxial source/drain regions 292, (ii) the dimensions of the vertical openings 232, (iii) whether a passivation process is performed prior to the isotropic etch, and/or (iv) the isotropic etch chemistry, each of which may affect the lateral expansion amount dw and the vertical expansion amount dh. For example, the end portion 234e may be a partial spheroid, such as a partial-sphere, partial-ellipsoid, or the like.

Figures 8A, 8B:
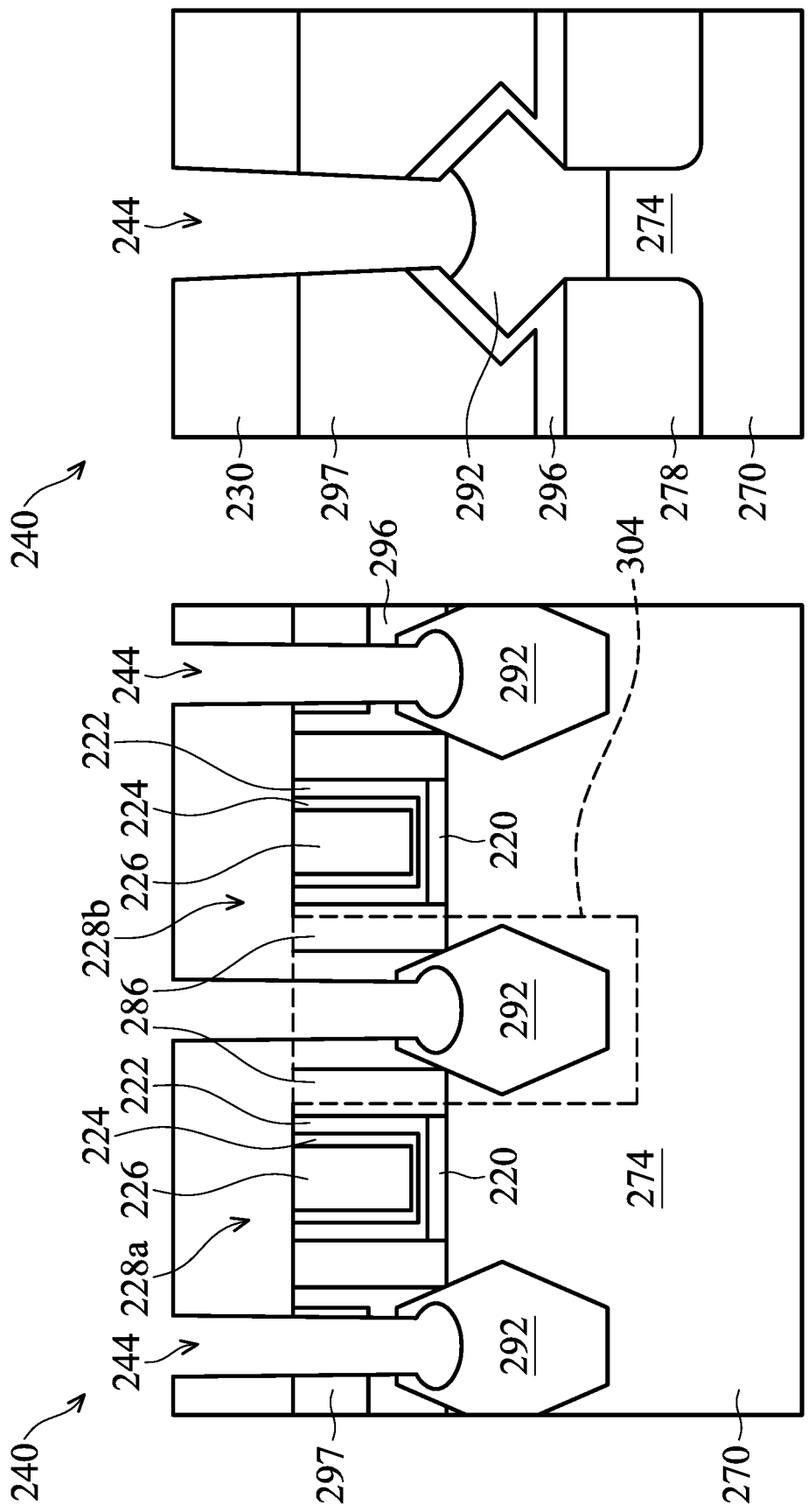
FIGS. 8A-8B and 9A-9B are schematic cross-sectional views of a portion of a semiconductor device corresponding to various stages in another example manufacturing process according to some embodiments.

FIGS. 8A and 8B illustrate expanded openings 244 having a different shape than the expanding openings 234. Similar to the expanded openings 234 of FIGS. 6A and 6B, the expanded openings 244 are formed by expanding the vertical openings 232 of FIGS. 5A and 5B by an isotropic etch process as described with FIG. 6A.

Figure 13:
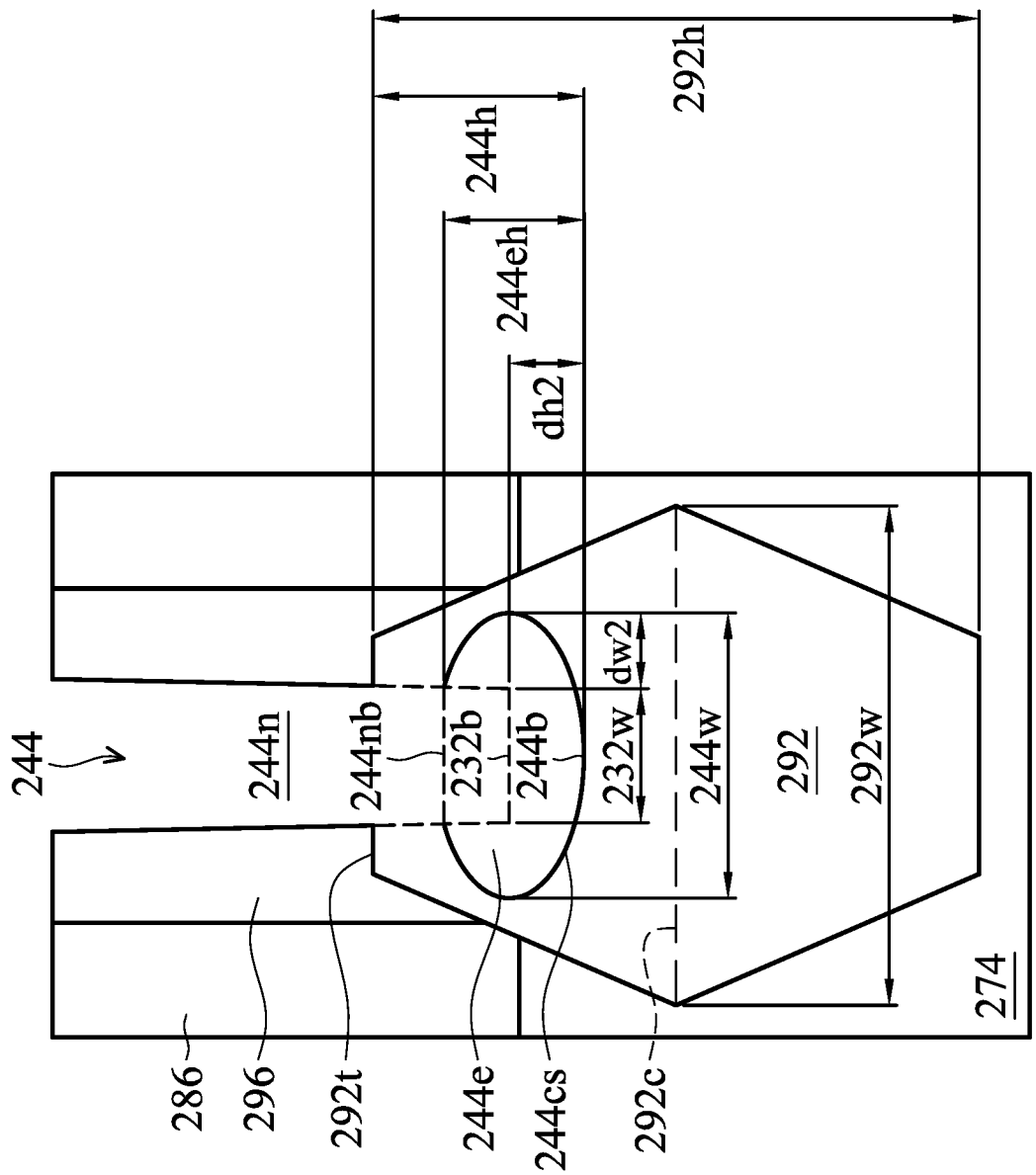
FIG. 13 illustrates a portion of the cross-sectional view of FIG. 8A to further illustrate additional details in accordance with some embodiments.

FIG. 13 is an enlarged view of region 304 in FIG. 8A showing details of the expanded opening 244. The bottom portion of the vertical opening 232 is shown in dashed line. The expanded opening 244 includes a neck portion 244n formed through the second ILD 230, the first ILD 297, the CESL 296, and the upper portion of the epitaxial source/drain region 292, and an end portion 244e formed in the epitaxial source/drain region 292 below the top 292t of the epitaxial source/drain region 292. The neck portion 244n may be a trench or a cylinder having substantially vertical walls. The neck portion 244n may have a width that is substantially similar to the width 232w of the vertical openings 232. A bottom 244nb of the neck portion 244n is below the top 292t of the epitaxial source/drain region 292.

The end portion 244e may have an elliptical cross section area along the cross-section A-A (refer to FIG. 1). The end portion 244e may have an ellipsoidal shape with an ellipsoidal surface 244cs formed in the epitaxial source/drain region 292.

A height 244h indicates a distance from the top 292t of the epitaxial source/drain region 292 to a bottom point 244b of expanded opening 244. In some embodiments, the height 244h may be in a range from about 2 nm to about 20 nm. In some embodiments, the height 244h may be in a range from about 5% to about 50% of the height 292h of the epitaxial source/drain region 292. A height 244eh indicates a height of the end portion 244e, e.g., a distance from the bottom 244nb of the neck portion 244n to the bottom point 244b of expanded opening 244. The height 244eh is smaller the than height 244h.

In some embodiments, a width 244w of the end portion 244e may be in a range from about 14 nm to about 40 nm. In some embodiments, the width 244w may be in a range from about 10% to about 50% of the width 292w of the epitaxial source/drain region 292.

The end portion 244e is formed by laterally expanding the vertical openings 232 in the epitaxial source/drain region 292 by a lateral expansion amount dw2 and by vertically expanding the vertical opening 232 in the epitaxial source/drain region 292 by a vertical expansion amount dh2. In some embodiments, the vertical expansion amount dh2 can be in a range from about 2 nm to about 20 nm. For example, for an n-type FinFET device, the vertical expansion amount dh2 can be in a range from about 2 nm to about 20 nm. For a p-type FinFET device, the vertical expansion amount dh2 can be in a range from about 2 nm to about 10 nm. In some embodiments, the lateral expansion amount dw2 can be in a range from about 2 nm to about 10 nm. Hence, the width 244w of the end portion 244e can be in a range from about 4 nm to about 20 nm greater than the width 232w of the openings 244. In some examples, the width 244w of the end portion 244e is equal to or greater than about 5% more than the width 232w of the openings 244, such as in a range from about 5% to about 50% more than the width 232w of the openings 244. The increased width 244w can increase surface area to which a conductive feature can contact the source/drain regions 292. More specifically, for example, for an n-type FinFET device, the lateral expansion amount dw2 can be in a range from about 2 nm to about 10 nm. For a p-type FinFET device, the lateral expansion amount dw2 can be in a range from about 2 nm to about 5 nm. In some embodiments, the source/drain regions 292 in n-type devices and in p-type devices can have different dimensions (e.g., widths and/or heights) due to different materials that are epitaxially grown as the source/drain regions 292. For example, heights and widths of source/drain regions 292 of p-type devices can be smaller than heights and widths of source/drain regions 292 of n-type devices, and hence, vertical expansion amounts dh2 and lateral expansion amount dw2 in source/drain regions 292 of p-type devices can be less than vertical expansion amounts dh2 and lateral expansion amount dw2 in source/drain regions 292 of n-type devices.

In some embodiments, one or more of the anisotropic etch processes described above with respect to FIGS. 5A and 5B can passivate surfaces of the vertical openings 232. In some examples, the passivated surfaces have $C_xH_yF_z$ formed thereon as a result of the anisotropic etch process(es). After the anisotropic etch processes of FIGS. 5A and 5B, an additional anisotropic etch process, such as using a plasma formed from oxygen ($O_2$), hydrogen ($H_2$), or the like, can break through or remove the passivated surface on the bottom of each vertical opening 232. Subsequently, the isotropic etch can selectively etch through the bottom surface of the vertical opening 232 (e.g., etch the respective epitaxial source/drain region 292) without etching the passivated sidewalls of the vertical opening 232 (e.g., including sidewalls of the vertical opening 232 in the epitaxial source/drain region 292). Hence, the profile in FIGS. 8A, 8B, and 13 can be achieved.

Figures 9A, 9B:
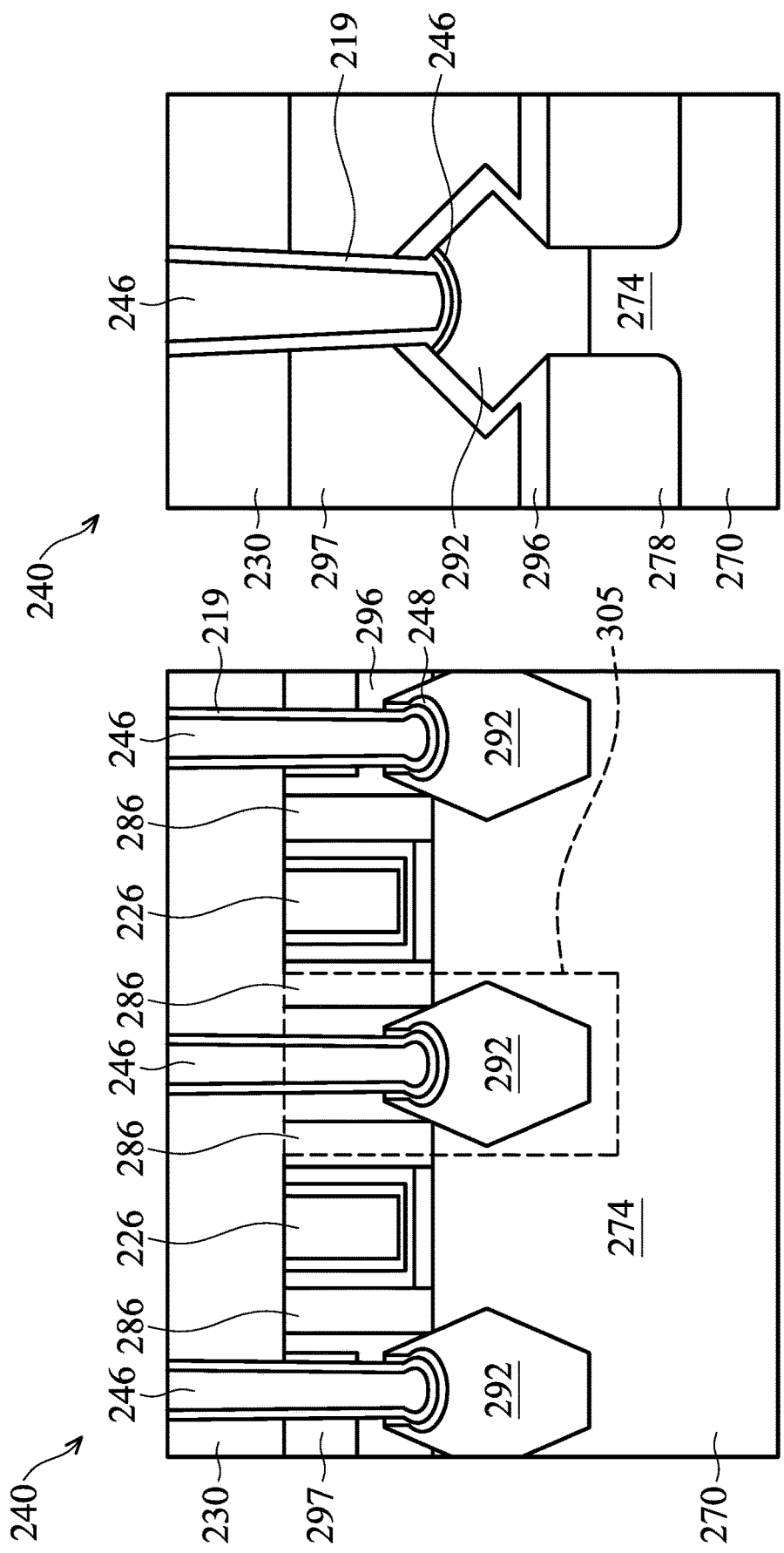

In FIGS. 9A and 9B, silicide layers 248 are formed on the surfaces of the epitaxial source/drain regions 292 in the expanded openings 244; a barrier layer 219 is formed conformally in the expanded openings 244; and a conductive material 246 is formed over the barrier layer 219 and filling the expanded openings 244, like described with respect to FIGS. 7A and 7B.

Figure 14:
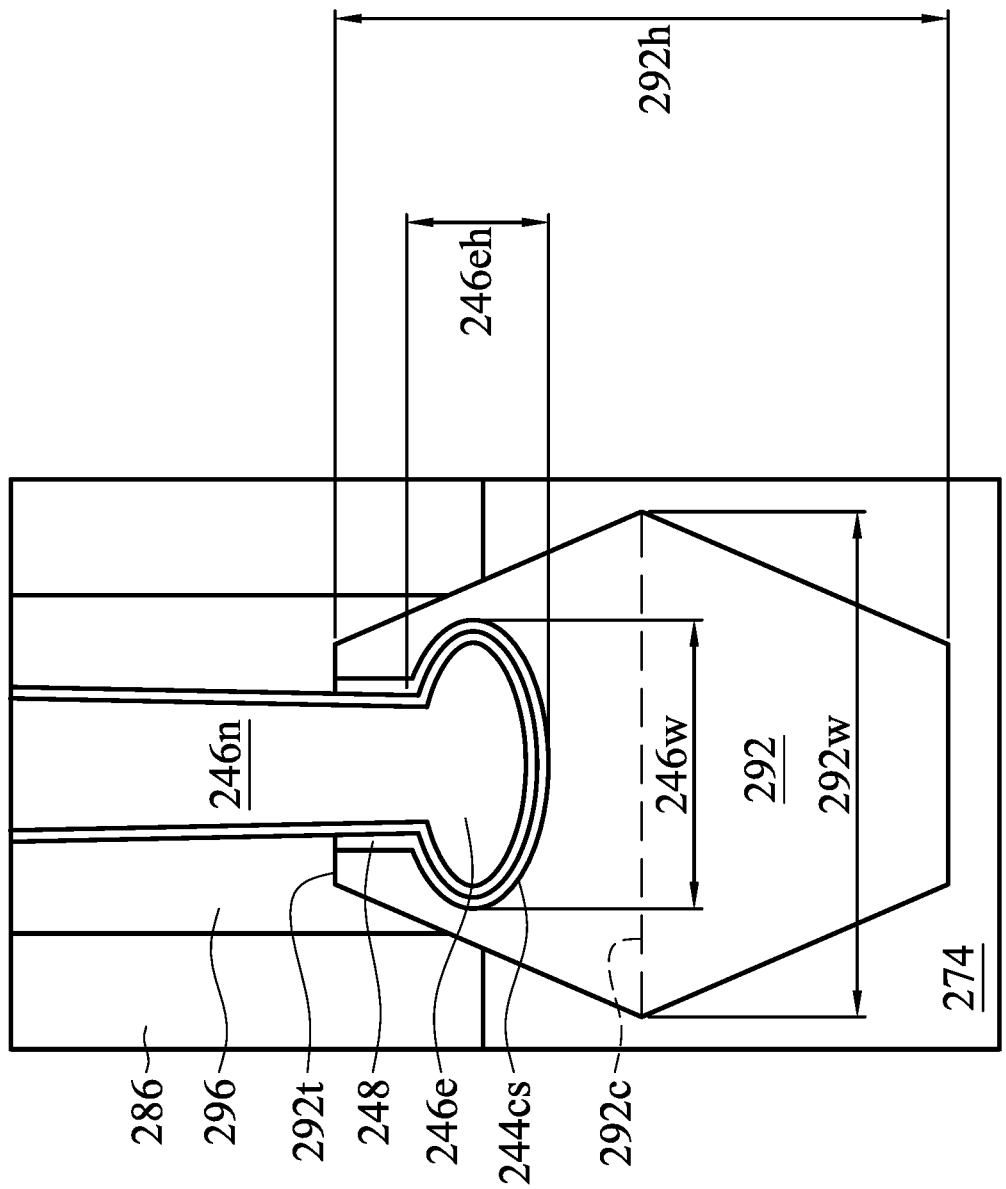
FIG. 14 illustrates a portion of the cross-sectional view of FIG. 9A to further illustrate additional details in accordance with some embodiments.

FIG. 14 is an enlarged view of region 305 in FIG. 9A showing the details of the conductive material 246 and the silicide layer 248. The silicide layer 248 corresponds to the ellipsoidal surface 244cs of the end portion 244e in the expanded opening 244 and sidewalls of the epitaxial source/drain region 292 formed by the neck portion 244n of the expanded opening 244, and therefore, can have an increased surface area. The increased surface area of the silicide layer 248 can reduce the resistance between the epitaxial source/drain region 292 and the contact formed in the expanded opening 244.

The conductive material 246 includes a neck portion 246n formed through the second ILD 230, the first ILD 297, the CESL 296, and a portion of the epitaxial source/drain region 292, and an end portion 246e formed in the epitaxial source/drain region 292. The neck portion 246n may be a trench or a cylinder having substantially vertical walls. The neck portion 246n may have a width in a range from about 10 nm to about 50 nm. The end portion 246e may have an elliptical cross section area along the cross-section A-A (refer to FIG. 1). The end portion 246e may have an ellipsoidal shape with an ellipsoidal surface facing the silicide layer 248.

A height 246eh of the end portion 246e may be in a range from about 2 nm to about 20 nm. A width 246w of the end portion 246e may be in a range from about 10 nm to about 50 nm. In some embodiments, the width 246w of the end portion 246e may be greater than the width of the neck portion 246n by an amount in a range from about 2 nm to about 20 nm. The depth and width of the end portion 246e can enable increased contact surface of the end portion 246e to the epitaxial source/drain region 292, and thus, can reduce resistance therebetween.

The combination of anisotropic etch and isotropic etch described here can expose an increased surface area of the source/drain region, and thus a contact area between the source/drain region and the contact feature can be increased. The increased contact area can reduce resistance between the contact feature and the source/drain region, and therefore, performance of the devices can be improved.

In an embodiment, a structure is provided. The structure includes an active area including a source/drain region, a dielectric layer over the active area, and a conductive feature through the dielectric layer to and contacting the source/drain region. The conductive feature includes a neck portion through the dielectric layer, and an end portion extending in the source/drain region. A width of the end portion is greater than a width of the neck portion.

In another embodiment, a method is provided. The method includes forming a vertical opening through a dielectric layer over a source/drain region of an active area to expose a portion of an upper surface of the source/drain region, and expanding the vertical opening to form an expanded opening in the dielectric layer and in the source/drain region. The expanded opening includes a neck portion through the dielectric layer and an end portion in the source/drain region. The neck portion has a first width, and the end portion has a second width that is greater than the first width.

In yet another embodiment, a method for semiconductor processing is provided. The method includes forming a source/drain region in an active area on a substrate, forming a dielectric layer over the active area and the source/drain region, anisotropically etching through the dielectric layer to form an opening, the opening exposing at least a portion of an upper surface of the source/drain region, isotropically etching, through the opening, the source/drain region to laterally and vertically expand an end portion of the opening, and forming a conductive feature in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   forming a source/drain region on a substrate;
   forming a dielectric layer over the source/drain region;
   forming an opening through the dielectric layer and partially into the source/drain region using a first etch process;
   laterally and vertically expanding the opening in the source/drain region using a second etch process different than the first etch process to form an expanded end portion, wherein a widest dimension of the expanded end portion of the opening is at an uppermost surface of the source/drain region in a cross-section perpendicular to longitudinal axis of a gate structure; and
   forming a conductive feature in the expanded end portion of the opening.

2. The method of claim 1, wherein the first etch process comprises an anisotropic etch process and the second etch process comprises an isotropic etch process.

3. The method of claim 1, wherein the second etch process comprises an inductively coupled plasma etch process.

4. The method of claim 3, wherein an etchant gas comprises a fluorocarbon-based gas, a fluorine-based gas, a chlorine-based gas, or a bromine-based gas.

5. The method of claim 3, wherein an RF power of a plasma generator during the inductively coupled plasma etch process is in a range from about 100 W to about 2000 W.

6. The method of claim 3, wherein a chamber pressure for the inductively coupled plasma etch process is in a range from about 30 mTorr to about 800 mTorr.

7. The method of claim 3, wherein a bias voltage for the inductively coupled plasma etch process is in a range from about 0 volt to about 200 volt.

8. The method of claim 3, wherein the second etch process is performed for a duration in a range from about 5 seconds to about 100 seconds.

9. A method for semiconductor processing, the method comprising:
   forming a dummy gate stack;

forming a source/drain region adjacent the dummy gate stack;

forming one or more dielectric layers over the source/drain region;

forming a first opening through the one or more dielectric layers using a first anisotropic etch process, the first opening extending into the source/drain region to a first depth, the first opening having a first width in the source/drain region in a first cross-section;

expanding the first opening to form an expanded opening in the source/drain region using a first isotropic etch process, the expanded opening in the source/drain region having a second depth and a second width, the second depth being greater than the first depth, the second width being greater than the first width, wherein the expanded opening exposes a lower surface of a bottom dielectric layer of the one or more dielectric layers; and forming a conductive element in the expanded opening.

10. The method of claim 9, wherein a distance from the lower surface of the bottom dielectric layer to a bottom of the expanded opening is in a range from 10% to 50% of a height of the source/drain region.

11. The method of claim 9, wherein a width of the expanded opening in the source/drain region is in a range from 5% to 50% more than a width of the expanded opening in the bottom dielectric layer.

12. The method of claim 9 further comprising, prior to forming the conductive element, forming a silicide layer along a surface of the source/drain region.

13. The method of claim 12, wherein the silicide layer contacts the bottom dielectric layer.

14. The method of claim 9, wherein a portion of the bottom dielectric layer extends along a lower surface of the source/drain region.

15. The method of claim 9 further comprising:

replacing the dummy gate stack with a replacement gate stack, wherein a portion of the source/drain region is interposed between expanded opening and an upper surface of the source/drain region along a line parallel with a sidewall of the replacement gate stack.

16. A method for semiconductor processing, the method comprising:

forming an epitaxial source/drain region over a fin;

forming a gate stack over the fin;

forming one or more dielectric layers over the epitaxial source/drain region, the one or more dielectric layers having a bottommost layer directly contacting the epitaxial source/drain region;

performing a first etch process to form a first recess extending through the one or more dielectric layers and partially into the epitaxial source/drain region;

performing a second etch process to laterally and vertically expand the first recess in the epitaxial source/drain region to form a second recess, the second recess extending along an underside surface of the bottommost layer; and forming a conductive element in the second recess.

17. The method of claim 16 further comprising forming a silicide layer over the epitaxial source/drain region, the silicide layer contacting the underside surface of the bottommost layer.

18. The method of claim 17, wherein the conductive element contacts the underside surface of the bottommost layer.

19. The method of claim 16, wherein the second etch process laterally expands the first recess by an amount in a range from 2 nm to 20 nm and vertically expands the first recess by an amount in a range from 2 nm to 20 nm.

20. The method of claim 16, wherein the second etch process comprises performing a dry etch process using an etchant including at least one of carbon tetrafluoride (CF4), trifluoromethane (CHF3), nitrogen trifluoride (NF3), sulfur hexafluoride (SF6), chlorine gas (Cl2), or hydrogen bromide (HBr).

21. The method of claim 16, wherein the second etch process comprises performing a wet etching process using an etch solution of ammonium hydroxide, hydrogen peroxide, and water in a ratio in a range from 1:1:8000 to 1:1:100 (ammonium hydroxide:hydrogen peroxide:water).

* * * * *